(12) United States Patent
Farquhar et al.

(10) Patent No.: US 7,128,256 B2
(45) Date of Patent: Oct. 31, 2006

(54) Z-INTERCONNECTIONS WITH LIQUID CRYSTAL POLYMER DIELECTRIC FILMS

(75) Inventors: Donald S. Farquhar, Endicott, NY (US); Douglas O. Powell, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 10/813,411

(22) Filed: Mar. 30, 2004

(65) Prior Publication Data

US 2004/0182509 A1    Sep. 23, 2004

Related U.S. Application Data

(62) Division of application No. 10/392,637, filed on Mar. 18, 2003, now Pat. No. 6,764,748.

(51) Int. Cl.
*B23K 31/00* (2006.01)

(52) U.S. Cl. .................................. 228/123.1

(58) Field of Classification Search ............. 228/123.1, 228/30, 235.2; 428/209, 901; 174/250, 174/258
See application file for complete search history.

(56) References Cited

U.S. PATENT DOCUMENTS

| 5,719,534 | A | 2/1998 | Imura |
| 5,870,274 | A | 2/1999 | Lucas |
| 6,124,004 | A | 9/2000 | Furuta et al. |
| 6,274,242 | B1 | 8/2001 | Onodera et al. |
| 6,323,436 | B1 | 11/2001 | Hedrick et al. |
| 6,326,555 | B1 | 12/2001 | McCormack et al. |
| 6,334,922 | B1 | 1/2002 | Tanaka et al. |
| 6,451,710 | B1 | 9/2002 | Oka et al. |
| 6,528,145 | B1 | 3/2003 | Berger et al. |

*Primary Examiner*—Jonathan Johnson
(74) *Attorney, Agent, or Firm*—Schmeiser, Olsen & Watts; William H. Steinberg

(57) ABSTRACT

A multilayered stack and method of formation. First and second dielectric layers are formed, respectively including first and second liquid crystal polymer (LCP) dielectric materials, with an electrically conductive plug through the first dielectric layer. A first and second electrical circuitization is formed in direct mechanical contact with a surface of the first and second dielectric layer, respectively, wherein the second electrical circuitization mechanically and electrically contacts an end of the plug, and wherein the plug is fluxlessly soldered to the first electrical circuitization. The first and second dielectric layers and the first electrical circuitization are subjected to a temperature below the lowest nematic-to-isotropic transition temperature of the first and second LCP dielectric materials, for a dwell time and elevated pressure sufficient to cause the first and second LCP dielectric materials to directly bond the second dielectric layer to the first dielectric layer and to the first electrical circuitization.

10 Claims, 10 Drawing Sheets

Z-INTERCONNECTIONS WITH LIQUID CRYSTAL POLYMER DIELECTRIC FILMS

This application is a divisional of Ser. No. 10/392,637; filed on Mar. 18, 2003 now U.S. Pat. No. 6,764,748.

TECHNICAL FIELD

The present invention relates generally to multilayered laminates, and more particularly to multilayered laminates with dielectric layers that include liquid crystal polymer (LCP) dielectric material.

RELATED ART

Organic substrates comprising multilayer laminates have been and continue to be developed for many applications. However, it would be desirable to reduce costs and inefficiencies that currently characterize fabrication of multilayer laminates.

SUMMARY OF THE INVENTION

The present invention provides a multilayered stack, comprising:

a first dielectric layer that includes a first liquid crystal polymer (LCP) dielectric material, wherein a first electrical circuitization is on and in direct mechanical contact with a surface of the first dielectric layer; and a second dielectric layer that includes a second LCP dielectric material, wherein a first electrically conductive plug includes a first electrically conductive material and extends through a thickness of the second dielectric layer, wherein a second electrical circuitization is on and in direct mechanical contact with a surface of the second dielectric layer, wherein the second electrical circuitization is in direct mechanical and electrical contact with a first end of the first electrically conductive plug, wherein the second dielectric layer is directly bonded to the first dielectric layer with no extrinsic adhesive material bonding the second dielectric layer to the first dielectric layer, wherein the second dielectric layer is directly bonded to the first electrical circuitization with no extrinsic adhesive material bonding the second dielectric layer to the first electrical circuitization, and wherein the first electrically conductive plug is fluxlessly soldered to the first electrical circuitization.

The present invention provides method for forming a multilayered stack, comprising the steps of:

forming a first dielectric layer that includes a first liquid crystal polymer (LCP) dielectric material, wherein a first electrical circuitization is on and in direct mechanical contact with a surface of the first dielectric layer;

forming a second dielectric layer that includes a second LCP dielectric material, wherein a first electrically conductive plug includes a first electrically conductive material and extends through a thickness of the second dielectric layer, wherein a second electrical circuitization is on and in direct mechanical contact with a surface of the second dielectric layer, wherein the second electrical circuitization is in direct mechanical and electrical contact with a first end of the first electrically conductive plug;

fluxlessly soldering the first electrically conductive plug to the first electrical circuitization; and subjecting the first dielectric layer, the second dielectric layer, and the first electrical circuitization to a temperature less than the lowest nematic-to-isotropic transition temperature of the first and second LCP dielectric materials, for a dwell time and at an elevated pressure that is sufficient to cause the first and second LCP dielectric materials to plastically deform and directly bond the second dielectric layer to the first dielectric layer and directly bond the second dielectric layer to the first electrical circuitization with no extrinsic adhesive material disposed between the second dielectric layer and the first dielectric layer and with no extrinsic adhesive material disposed between the second dielectric layer and the first electrical circuitization.

The present invention advantageously reduces processing time and processing costs in the fabrication of multilayer laminates.

DETAILED DESCRIPTION OF THE INVENTION

Figure 1:
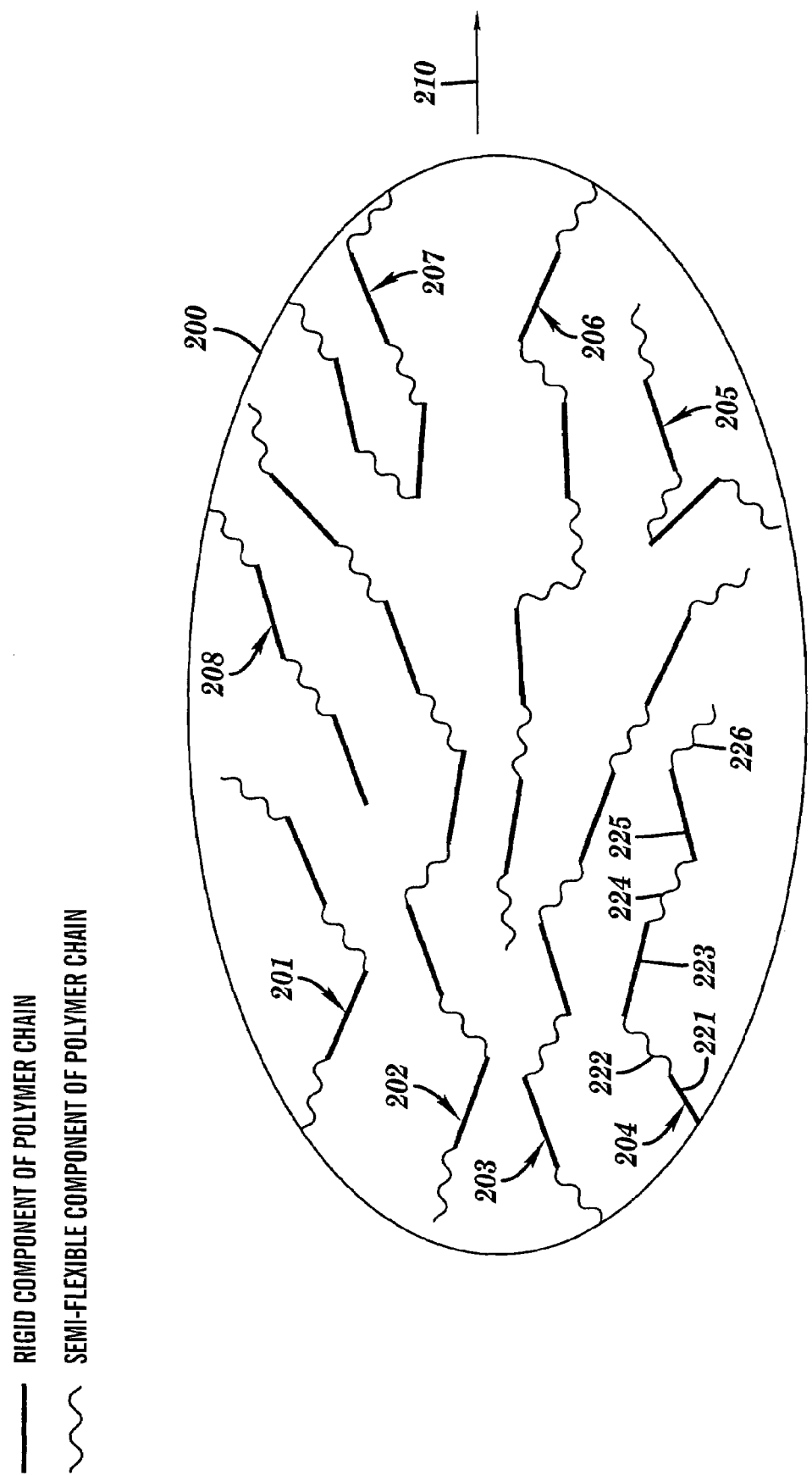
FIG. 1 depicts a localized molecular domain in the liquid crystal phase of a liquid crystal polymer (LCP) dielectric, with directional ordering of polymer chains, in accordance with embodiments of the present invention.

Liquid crystal polymer (LCP) dielectric materials have many positive attributes for forming dielectric layers, including good dielectric properties, low cost, and good mechanical properties. LCP dielectric materials have some characteristics similar to those of polyimides, such as good tear resistance and good stretching resistance, which make LCP dielectric materials suitable for processing (e.g., circuitizing, plating, etc.) in very thin layers. LCP films may offer advantages over polyimide films such as better electrical properties, better moisture resistance, better dimensional stability, and lower cost. However, to form multilayer structures with either LCP or polyimide films generally requires the use of adhesive dielectric films. The present invention discloses how to cause LCP dielectric material to adhere to a layer of material (e.g., a metal layer or a dielectric layer) without need for an extrinsic intervening adhesive layer, which reduces layer thickness, processing costs, and material costs. In addition, LCP dielectric films of this type are flame retardant without the use of halogen based additives. Multilayer composites made with these dielectrics may also be flame retardant without the use of halogens.

A commercially available LCP dielectric material that may be used in conjunction with the present invention is the BIAC thermotropic liquid crystal polymers which exhibit thermoplastic behavior and are manufactured in sheet or roll form by W. L. Gore & Associates, Inc. Information on the BIAC liquid crystal polymers may be obtained at the web site: http//www.gore.com/electronics. Another commercially available LCP dielectric material that may be used in conjunction with the present invention is the ZYVEX LCP thermotropic liquid crystal polymers which exhibit thermoplastic behavior and are manufactured in roll form by the Rogers Corporation. Generally, any LCP dielectric material is potentially usable with the present invention, depending on the material properties desired in a given application.

U.S. Pat. No. 6,274,242 (Onodera et al. 2001) ("Onodera '242"), hereby incorporated by reference in its entirety, discloses a method of making LCP films which include well known thermotropic liquid crystal polyester and thermotropic liquid crystal polyester amide. Said LCP films are prepared from four classes of compounds identified in Tables 1–4 of Onodera '242. Examples of resultant LCP structural units derived from the four classes of compounds are illustrated in Table 5 of Onodera '242. The LCP dielectrics disclosed in Onodera '242 are merely exemplary, and many other LCP dielectrics are within the scope of the present invention. Generally, any method known to one of ordinary skill in the art may be used to make the LCP dielectric material.

A LCP dielectric may exist in one of three phases: a liquid crystal phase (e.g., nematic, smectic, cholesteric), an isotropic phase, and a chemically unstable phase, which respectively correspond to three temperature domains, namely a liquid crystal temperature domain, an isotropic temperature domain, and a chemically unstable temperature domain.

In the liquid crystal phase or liquid crystal temperature domain, localized molecular regions or domains of the LCP dielectric comprise polymer chains which are directionally ordered (i.e., anisotropically distributed) such as by processing. In the liquid crystal phase, different localized molecular domains may have different directional ordering, and many localized molecular domains may have little or no directional ordering. These polymer chains are typically less than fully rigid. Such a localized molecular domain having directional ordering may include domains of molecules and/or groups of adjacent molecules, such that the spatial extent of the localized molecular domain is of the order of a thousand or hundreds of angstroms or less. Macroscopic material properties of the LCP dielectric (e.g., coefficient of thermal expansion (CTE), dielectric constant, thermal conductivity, etc.) are sensitive to the directional order in the localized molecular regions, and material properties of LCP dielectric materials are anisotropic in accordance with the directional ordering. The macroscopic material properties of the LCP dielectric are also dependent on the shape, size, shape distribution, and size distribution of the localized molecular regions.

The LCP dielectric material is manufactured by techniques known to one of ordinary skill in the art to produce a directional ordering that provides the desired material properties in the liquid crystal phase. Such techniques may include, inter alia, two-dimensional shear imparted to the LCP dielectric material through film extrusion or through stretching in the roll direction and stretching in the direction normal to the roll direction, as the LCP dielectric material is being unrolled at a prescribed temperature and velocity. The shear may alternatively be imparted by strong polarizing electric fields.

The LCP dielectric material remains in the liquid crystal phase if its temperature is in the liquid crystal temperature range; i.e., below a temperature called the nematic-to-isotropic transition temperature ($T_{NI}$). Thus, $T_{NI}$ represents the transition from the liquid crystal phase to the isotropic phase of a LCP dielectric material. The numerical value of $T_{NI}$ depends on the specific LCP dielectric material being utilized. Additionally, the directional ordering and consequent macroscopic material properties of the LCP dielectric material are essentially invariant to changes in temperature provided that the temperature remains within the liquid crystal temperature range and does not depart from the liquid crystal temperature range. Macroscopic material properties are preserved as temperature is varied within the liquid crystal temperature domain, because there is insufficient thermal energy in the liquid crystal phase to reorient the directionality of polymer chains of the LCP dielectric material (i.e., to overcome the inter-molecular attractive forces).

The LCP dielectric material plastically deforms when subject to high pressure in the liquid crystal phase. For example, in the manufacturing of chip carriers, the high pressure may result from a combination of applied normal pressure and local geometrical irregularities such as stress concentrations resulting from surface roughness, signal lines, vias, etc. Thus if the LCP dielectric material is laminated to a layer of material (comprising dielectric, metal, etc.) at high pressure and at elevated temperature within the liquid crystal phase, then the LCP dielectric material will plastically deform and conform to the macroscopic geometry of the surface and surface features (e.g., vias) of the layer of material. This capability of the LCP dielectric material to plastically conform, under sufficient pressurization while in the liquid crystal phase during the dwell time, to the surface and surface features of an adjacent layer is an unexpected result determined through experimentation by the inventors of the present invention, and serves as a foundational basis for the present invention. With the present invention, LCP dielectric material may be laminated to an adjacent surface of a layer of material through elevation of temperature within the liquid crystal temperature domain, and under sufficient pressurization to induce plastic deformation and consequent adhesion to the adjacent surface, while preserving its macroscopic material properties. This process of plastic adhesion does not require the presence of an extrinsic adhesive layer to bond the LCP dielectric material to the adjacent layer.

FIG. 1 depicts a localized molecular domain 200 in the nematic type liquid crystal phase with directional ordering of polymer chains, in accordance with embodiments of the present invention. The domain 200 includes polymer chains 201–208 ordered directionally such that the average directional orientation, angularly integrated over the directional orientations of the polymer chains 201–208, is approximately in the direction 210. Such angular integration may be performed in various ways as is known to one of ordinary skill in the art (e.g., different components of a given polymer chain may be weighted differently in the angular integration). Regardless of this specific definition used to define the angular average, however, the angular distribution of the directional orientations is clearly anisotropic such that there is a preferred direction at or near the direction 210.

In this illustration, each of polymer chains 201–208 is shown as a linear chain of alternating rigid and semi-flexible components. For example, polymer chain 204 comprises the sequence of polymer components 221–226, wherein components 221, 223, and 225 are rigid components, and wherein components 222, 224, and 226 are semi-flexible components. An example of a rigid component is a polymer having a polymer backbone that includes repeating units of substituted aromatic rings (e.g., benzene, biphenyl, naphthalene, etc.) such as disclosed in U.S. Pat. No. 6,274,242 (Onodera et al, see Tables 1, 2, 3, 4, and 5) and U.S. Pat. No. 5,900,292 (Moriya, see formulae 1, 2, 3, and 4). The rigid component may have reactive functional groups (e.g., hydroxy, amine, cyanate, carboxylic acid, and combinations thereof, etc.). An example of a semi-flexible component is a polymer having a polymer backbone that includes repeating units such as aliphatic segments (e.g., oxymethylene units, oxyethylene units, vinyl ether units, siloxanes units, etc.). The semi-flexible component may have chemically functional groups (e.g., hydroxy, amine, cyanate, carboxylic acid, and combinations thereof, etc.). Such a polymer may be prepared in two ways. First, the ends of adjacent rigid and semi-flexible components may be chemically coupled to each other to form esters, ethers, amides, etc. links in the polymer chain. Second, the ends of adjacent rigid components may be chemically coupled to each other to form ester, ether, amides (etc.) links in the polymer chain. In this second case, the links or connecting segments (esters, ethers, amides, etc.) would be the only semi-flexible component.

While FIG. 1 shows polymer chains 201–208 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 1, shows polymer chains 201–208 as each being a linear chain of components, any polymer chain topography is within the scope of a localized molecular domain. For example, a localized molecular domain may also or alternatively include a chain structure that comprises one or more side chains linked to a linear chain. While FIG. 1, shows a two-dimensional representation of linear chains, the localized molecular domain generally has chain structures which are oriented in three-dimensional space. For example, portions of any of the polymer chains 201–208 may extend above or below the depicted plane shown in FIG. 1. Accordingly, FIG. 1 may be viewed as a projection of a three-dimensional localized molecular domain onto a two-dimensional surface and the chains pictured may continue above and below the depicted plane.

In the isotropic phase or isotropic temperature domain, which exists at temperatures at or above the nematic-to-isotropic transition temperature ($T_{NI}$), there is sufficient available thermal energy to permit molecular diffusion and motion to change the directional ordering within the LCP dielectric. Thus as temperature changes from below $T_{NI}$ to above $T_{NI}$, there is a loss of directional order and the directional orientations become more random. As a consequence, macroscopic material properties will generally change in the temperature transition from below $T_{NI}$ to above $T_{NI}$, since the macroscopic material properties are sensitive to direction orientations of polymer chains in the LCP dielectric material, as described supra. When lamination of LCP dielectric material to a layer of material is performed at a temperature in the isotropic temperature range, the LCP dielectric material softens and liquefies and thus flows into the macroscopic geometry of the surface and surface features of the layer of material. Upon subsequent cooling its thermal history and processed-in directional order is changed. In contrast, when lamination of LCP dielectric material to a layer of material is performed at a temperature in the liquid crystal temperature range with sufficient pressurization, the LCP dielectric material does not flow but rather plastically deforms into the macroscopic geometry of the surface and surface features of the layer of material, as explained supra. The present invention teaches lamination of LCP dielectric material to a layer of material only at a temperature in the liquid crystal temperature range and thus teaches an invention that preserves macroscopic material properties during the laminating process. The lower temperature in the liquid crystal temperature range prevents any risk of the material melting or of domain re-orientation of large regions. An additional advantage is that no extrinsic adhesive layer is needed to bond the LCP dielectric material to the layer of material.

Figure 2:
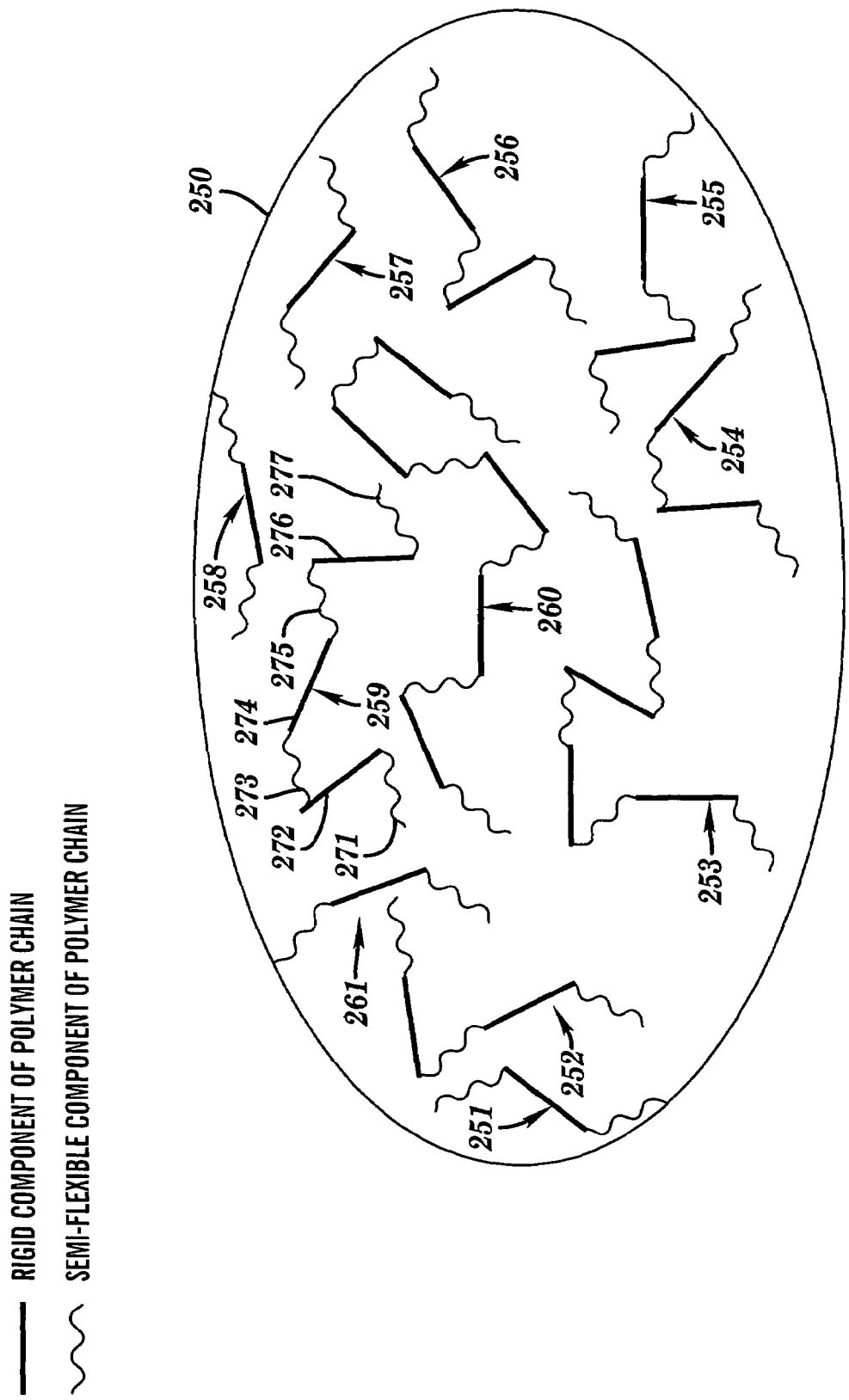
FIG. 2 depicts a localized molecular domain in the isotropic phase of a LCP dielectric, with little or no directional ordering of polymer chains, in accordance with embodiments of the present invention.

FIG. 2 depicts a localized molecular domain 250 in the isotropic phase in which there is little or no directional ordering of polymer chains, in accordance with embodiments of the present invention. The domain 250 includes polymer chains 251–260 ordered directionally such that the average directional orientation, angularly integrated over the directional orientations of the polymer chains 251–260, is approximately "zero"; i.e., there is essentially no preferred angular orientation or direction associated with the domain 250.

Each of polymer chains 251–260 is shown as a linear chain of alternating rigid and semi-flexible components. For example polymer chain 259 comprises the sequence of polymer components 271–277, wherein components 271, 273, 275, and 277 are semi-flexible components, and wherein components 272, 274, and 276 are rigid components. The rigid and semi-flexible components in the polymer chains of FIG. 2 are respectively analogous to the rigid and semi-flexible components in the polymer chains of FIG. 1, and the examples of rigid and semi-flexible polymer components discussed supra in conjunction with FIG. 1 likewise apply to the rigid and semi-flexible components of FIG. 2.

While FIG. 2 shows polymer chains 251–260 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 2, shows polymer chains 251–260 as each being a linear chain of components, any polymer chain topography is within the scope of a localized molecular domain. For example, a localized molecular domain may also or alternatively include a chain structure that comprises one or more side chains linked to a linear chain. While FIG. 2, shows a two-dimensional representation of linear chains, the localized molecular domain generally has chain structures which are oriented in three-dimensional space. For example, portions of any of the polymer chains 251–260 may extend above or below the depicted plane shown in FIG. 2. Accordingly, FIG. 2 may be viewed as a projection of a three-dimensional localized molecular domain onto a two-dimensional surface and the chains pictured may continue above and below the depicted plane.

In the chemically unstable phase or chemically unstable temperature domain, which occurs at significantly higher temperatures than the nematic-to-isotropic transition temperature ($T_{NI}$), there is sufficient available thermal energy to cause chemical decomposition within the LCP dielectric. The chemically unstable phase is not relevant to the present invention.

The present invention discloses a method for bonding LCP dielectric material to a layer of material (e.g., a dielectric layer or a metal layer or a combination thereof). As background for the present invention, the following discussion describes tests performed by the inventors of the present invention. In tests dating to 1994, the present inventors have attempted melt processing of LCPs, as known and taught in the art, to build multi-layer structures, with the approach of using precise temperature control to laminate the materials at temperatures just above or just below the "melting" temperature (i.e., $T_{NI}$) as determined by differential scanning calorimetry and by parallel plate rheometry. These experiments are characterized by inconsistent results in adhesion, laminate thickness, edge squeeze out, and importantly the physical properties of resulting laminate. Of particular note are the inconsistent changes that occurred in the coefficient of thermal expansion. This is a clear indication that the properties of the base laminate have been changed, essentially destroying their utility for the use intended, and therefore requiring the use of adhesive layers to form multi-layer circuits.

In contrast, experiments performed during June through September of 2002 have shown that by lowering the temperature to below $T_{NI}$, consistent adhesion is achieved without altering the properties of the base laminate. For example, Gore BIAC material, having a 2 mil thickness with 15 um of copper cladding on each side, was utilized. Etching away the copper, the inventors determined that the coefficient of thermal expansion (CTE) was approximately 20 to 25 ppm/° C. as received from the vendor. A thermal mechanical analyser was used to determine the CTE in various locations on a panel that measured approximately 13×18 inches. The CTE was measured in both x-coordinate and y-coordinate directions (i.e., in the two directions that are perpendicular to the thickness direction of the BIAC layer and also perpendicular to each other). Both a film-fiber configuration and a more conventional contacting probe were used to make these measurements.

After characterizing the properties of individual plies of the LCP, multi-ply laminates were prepared. The laminates comprised 4 ply and 6 ply thick composites formed using the Gore BIAC material, from which the copper cladding had been etched away. The parts were subjected to a lamination process that involved heating to 560° F. at a heatup rate of 15° F. per minute, next followed by a dwell time of approximately 20 to 30 minutes, and then followed by cooling at approximately 20° F. per minute to room temperature. Dwell time is defined herein, including in the claims, as a time interval during which the part being laminated is subjected to the highest temperature (within a reasonable temperature tolerance of said highest temperature due to statistical scatter and other minor variations) that the part experiences during the entire lamination process, said entire lamination process including all processing steps. Note that the maximum temperature of 560° F. is less that the liquid crystal transition temperature (assumed herein to be essentially the same as $T_{NI}$) of 635° F. of the Gore BIAC material. The lamination was accomplished using a flat bed press with electrically heated steel platens. The pressure was maintained at 2500 psi throughout the processing. Stainless steel planishing plates and copper release sheets were employed, as well as interleaving layers of polytetrafluoroethylene (PTFE) and copper to make a press pad above and below the tooling. Upon removal from the press, the inventors found no evidence of dielectric squeeze out at the edges of the laminate.

The thermal mechanical analysis was repeated and determined that the x-coordinate and y-coordinate (in-plane) CTE were unaltered by the lamination process. Adhesion tests were performed, using a 180 degree pull at 1 inch per minute, and an inner layer adhesion strength in excess of 6 lbf/inch was determined.

The same lamination process was repeated to evaluate the extent to which topography associated with realistic circuit features could be accommodated. A layer of Roger 2800 dielectric (PTFE/SiO2 filler) was used, and the layer of Roger 2800 dielectric had surface features including 12 um thick Cu formed into the circuit line of 30 to 50 um in width. The layer of the Gore BIAC LCP (50 um thick) was positioned above the Roger 2800 dielectric surface and the lamination was performed at the previously described conditions. Upon removal and subsequent cross sectioning, it was found that the circuit features were completely encapsulated. As before, there was no edge squeeze out. Adhesion testing showed an inner layer adhesion strength in excess of 4 lbf/inch between the LCP and Roger 2800 dielectric.

In another experiment, standard photolithography techniques were applied to copper clad LCP (i.e., 15 um copper cladded to Gore BIAC LCP) to form a pattern of clearance holes ranging from 50 to 500 um diameter on one of the copper surfaces. A second sheet of Gore BIAC LCP (with copper removed) was placed against the side of the first sheet that had the clearance holes. After repeating the lamination process as described supra, the part was cross-sectioned and it was determined that the holes were completely filled with BIAC LCP dielectric material. Again there was no evidence of edge squeeze out, and the adhesion was consistent across the panel.

The lamination experiments were first performed in panel sizes as small as 4"×4" in an electrically heated 75 ton laboratory press with no vacuum enclosure, manufactured by PHI Corporation. The results were duplicated in an electrically heated 125 ton Wabash press with a vacuum enclosure, and finally in a 600 ton electrically heated TMP press in 13"×18" format. These larger samples were used to establish the uniformity of adhesion, hole fill, and physical properties over a panel size that would be practical in manufacturing.

Based on the preceding experiments and supplementary analysis, which are consistent with the model (described supra) of directional ordering characteristics of LCP dielectric materials as being differentiated in the liquid crystal and isotropic phases, the basic technique of the present invention for laminating a LCP dielectric material to a layer of material (e.g., a dielectric layer or a metal layer or a combination thereof) is to perform the lamination at a temperature T wholly in the liquid crystal temperature range (i.e., $T<T_{NI}$) with no excursion into the isotropic temperature range, under sufficient pressurization and for a sufficient time to cause the LCP dielectric material to be effectively laminated to the layer of material.

For the Gore BIAC LCP material, $T_{NI}$ is about 635° F. For the Gore BIAC LCP material, the maximum lamination temperature should be less than 635° F.; however, due to temperature uncertainties and spatial variation, a maximum processing temperature for lamination may be about 620° F., and representative lamination temperature ranges include, inter alia, 540° F. to 620° F. and 545° F. to 580° F. For the Rogers ZYVEX LCP material, $T_{NI}$ is about 536° F. For the Rogers ZYVEX LCP material, the maximum lamination temperature should be less than 536° F.; however, due to temperature uncertainties and spatial variation, a maximum processing temperature for lamination may be about 520° F., and representative lamination temperature ranges include, inter alia, 440° F. to 520° F. and 465° F. to 490° F.

Although the preceding experiments were performed at a pressure of 2500 psi, the present inventors have used pressure in the range of 1000 to 3000 psi and achieved good adhesion. It was found that an improvement in uniformity correlated with increasing pressure. The effectiveness of the pressure depends on the aspect ratio of the features that must be filled during the lamination. The testing performed by the inventors thus far indicate that a range in pressure of 2000 to 2500 psi is particularly effective, as well as practical and economical for use in a conventional manufacturing environment. Extreme pressures can have the drawback of shortened life for the tooling and platens, and also require increased capacity for the press itself.

The dwell times used by the present inventors include keeping the material LCP dielectric pressurized at maximum temperature for durations as short as 2 to 5 minutes to durations as long as 60 minutes. It was found that no undesirable "edge squeeze out" or other evidence of excess flow occurs with the longer times, although some improvement in adhesion uniformity may result. Thus the maximum dwell time for temperature and pressure should generally be at least 2 minutes, and applicable ranges of dwell times include, inter alia, 2 to 60 minutes and 15 to 30 minutes. A minimum dwell is required to ensure temperature uniformity. However, the quality of the filling of features should improve with increasing dwell time. On the other hand, shorter times are favorable for economy of manufacturing, and the shorter dwell times reflect this goal of economy. Nonetheless, no upper limit of dwell time has been observed by virtue of the resulting properties of the laminates.

Repeating the lamination cycle twice may improve the uniformity of adhesion, and by repositioning the product in the lamination press (perhaps turning it 180 degrees), the low spots become high spots, resulting in more uniform adhesion, especially along the edges.

In accordance with the discussion of LCP dielectric materials and the testing relating to lamination of LCP dielectric materials to a layer of material, the LCP material used in the present invention may be a partially ordered liquid crystal polymer resulting from various processing steps which partially orient the microscopic liquid crystal domains directionally during the manufacturing of the LCP dielectric. Higher order smectic (i.e., orientational and positional order) phases may also be present. Although the preceding discussion focused on homogenous LCP dielectrics, the adhesiveless lamination process of the present invention is also applicable to LCP materials that contain fillers, such as ceramic or organic, particulate or fiber-like, or even metallic particles. Further, expanded PTFE as a reinforcement in LCP materials is within the scope of the present invention.

The desired material properties for the LCP dielectric material, in the context of the present invention, are application dependent. For various applications, material properties may comprise: in-plane CTE (i.e., CTE in direction perpendicular to the thickness direction of a LCP dielectric layer) of about 10 to 25 ppm/° C.; dielectric constant of about 2.5 to 3.0; Young's modulus of about 3 to 6 GPa; dissipation factor of less than about 0.003; and moisture absorption of less than about 0.2% for 96 hours at 121° C. and 2 atm. The thickness of the LCP dielectric layers can vary according to the desired design performance characteristics of the multi-layered interconnect structure, and said thicknesses may be about equal if so dictated by design performance requirements. For manufacturing efficiency, lamination is typically performed with a "book" that includes multiple pages.

Figure 4:
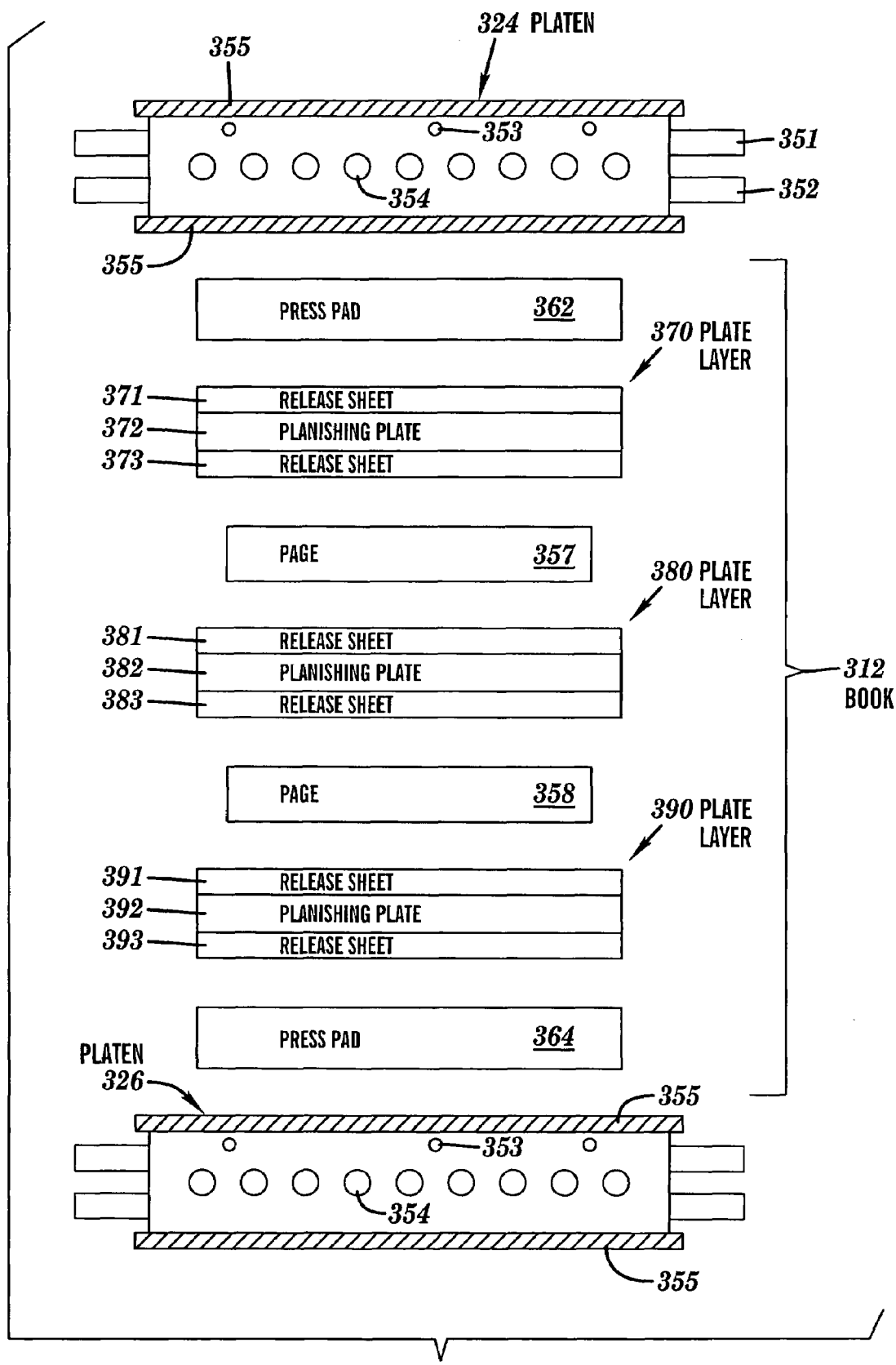
Figure 5:
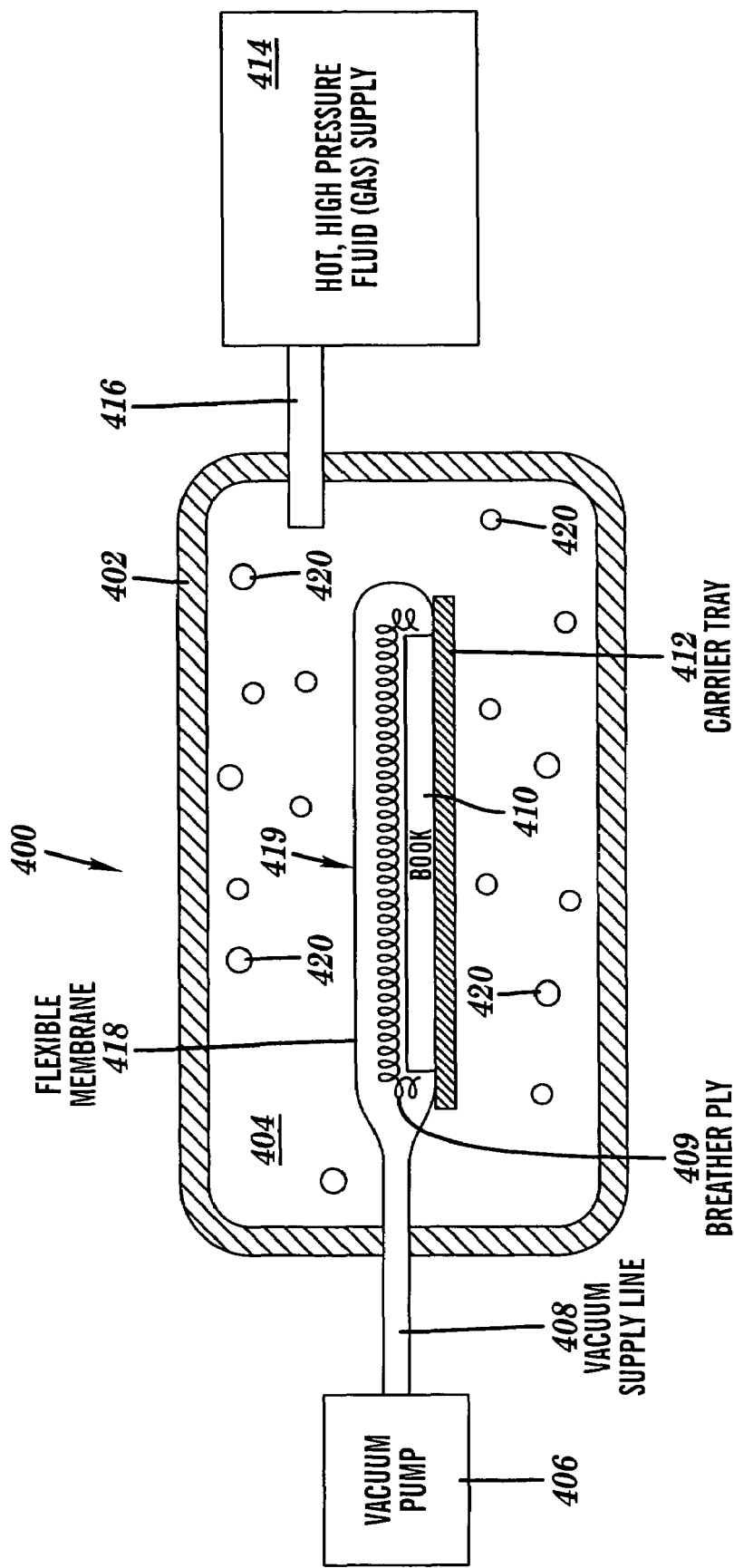
FIG. 5 illustrates an autoclave lamination press for lamination of stacked layers that include LCP dielectric material, in accordance with embodiments of the present invention.

The following discussion discloses two practical methods of performing lamination of a multi-layered interconnect structure (called a "page"), namely flat-bed press lamination (see FIGS. 3–4) and autoclave lamination (see FIG. 5).

Figure 3:
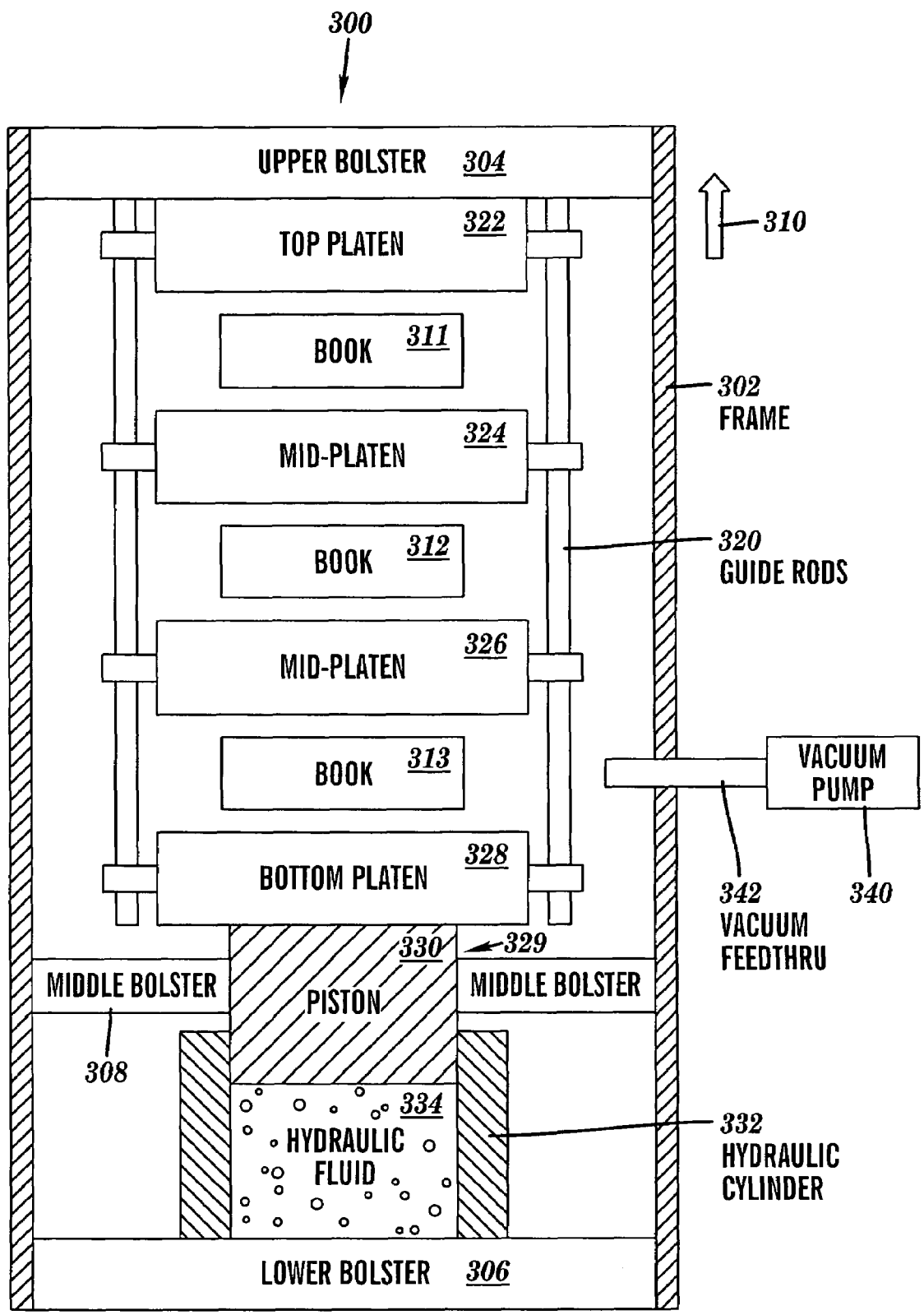
FIGS. 3 and 4 illustrate flat-bed press lamination for lamination of stacked layers that include LCP dielectric material, in accordance with embodiments of the present invention.

FIGS. 3 and 4 illustrate flat-bed press lamination for lamination of stacked layers that include LCP dielectric material, in accordance with embodiments of the present invention. In FIG. 3, a flat-bed lamination press 300 is enclosed and structurally supported by a frame 302. FIG. 3 depicts a three-opening flat-bed lamination press 300 that has an upper bolster 304, a middle bolster 308, a lower bolster 306, a top platen 322, mid-platens 324 and 326, a bottom platen 328, books 311–313, guide rods 320, a hydraulic system 329, a vacuum pump 340, and a vacuum feedthru 342. The platens 322, 324, 326, and 328 and books 311–313 may be supported from below by the middle bolster 308 and are constrained from above by the upper bolster 304. The platens 322, 324, 326, and 328 are supported laterally and guided vertically by the guide rods 320. The hydraulic system 329 comprises a hydraulic cylinder 332, hydraulic fluid 334, a piston 330, and a pump (not shown) that circulates the hydraulic fluid 334 by use of a supply line (not shown) that is coupled to the pump. The hydraulic system 329 is used to apply pressure to the platens. Typical operating pressures for the hydraulic fluid 334 are in a range of up to 5000 psi. The pressure applied to the books depends on the relative size of the book versus the diameter of the hydraulic piston 330. With the present invention, pressures in a range of, inter alia, about 1000 to about 3000 psi may be applied to the product layers within the books. The chamber of the press may be subject to a vacuum generated by the vacuum pump 340 with the vacuum feedthru 342, so as to minimize oxidation and entrapment of voids during lamination processing. Alternatively, the vacuum pump 340 may be omitted, or turned off and not used during lamination press operation. Not shown are the feedthroughs and supply lines for the platen heating and cooling systems which could be electrically or fluid heated, and fluid cooled.

Book 311 is disposed between top platen 322 and mid-platen 324. Book 312 is disposed between mid-platen 324 and mid-platen 326. Book 313 is disposed between mid-platen 326 and bottom platen 328. While FIG. 3 shows three books 311–313, the flat-bed lamination press 300 may process at least one of such books and as many books as can fit geometrically between the upper bolster 304 and the middle bolster 308, in consideration of the thickness in the direction 310 of the platens and the books. Each of books 311–313 comprises one or more pages, and each page comprises multiple layers and/or multilayered structures to be laminated together by pressurization through movement of the piston 330 in the direction 310 such that each book is compressed between the platens that contact the book on each side of the book (e.g., the book 312 is compressed between the platens 324 and 326). The multiple layers and/or multilayered structures of each page comprise one or more LCP dielectric layers. Upon actuation of the press, the piston 330 moves up in the direction 310 and platens 322, 324, 326, and 328 come into contact with books 311–313. The platens that contact the books during the lamination process not only provide surfaces for compressing the books during lamination, but also provide a heat source for elevating the temperature of the LCP dielectric layers in each page of each book as will be explained infra.

FIG. 4 shows the detailed structure of book 312 and platens 324 and 326 of FIG. 3, in accordance with embodiments of the present invention. The book 312 comprises an alternating sequence of plate layers and pages between press pads 362 and 364. In particular, the book 312, comprises the alternating sequence of: plate layer 370, page 357, plate layer 380, page 358, and plate layer 390. The plate layer 370 comprises a planishing plate 372 sandwiched between release sheets 371 and 373. The planishing plate 372 assists in planarizing the page 357. Various considerations are made in selecting the material of the planishing plate 372, including its thickness, size, and thermal expansion characteristics. In many applications, the planishing plate 372 may comprise stainless steel. The release sheets 371 and 373 should comprise a material (e.g, copper) that enables the plate layer to be easily detached from the page 357 after completion of the lamination processing. The plate layer 380 comprises a planishing plate 382 sandwiched between release sheets 381 and 383, and the planishing plate 382 and release sheets 381 and 383 are respectively analogous to the planishing plate 372 and release sheets 371 and 373. The plate layer 390 comprises a planishing plate 392 sandwiched between release sheets 391 and 393, and the planishing plate 392 and release sheets 391 and 393 are respectively analogous to the planishing plate 372 and release sheets 371 and 373. The press pads 362 and 364 may include a compliant material to give more uniform lamination by compensating for spatial thickness non-uniformities in the pages and release sheets.

Platens 324 and 326 are similarly constructed. In platen 324, heating elements 354 may generate heat in any form that is known to one of ordinary skill in the art such as generation of heat by electrical resistance heaters or by a heated circulating fluid (e.g., oil). Inlet tube 351 and outlet tube 352 are use to circulate fluid (e.g., air, water, etc.) through the platen 324 for cooling purposes. Platen 324 also includes thermocouple ports 353 for using thermocouples to measure platen 324 temperatures. Platen 324 is bounded by wear plates 355 for planarizing the book 312 as the book 312 is pressurized. The wear plates 355 are thermally conductive and transmit heat generated by the heating elements 354 to the book 312. The wear plates 355 should have good thermal conductivity and may comprise hardened steel in some applications.

FIG. 5 illustrates an autoclave lamination press for lamination of stacked layers that include LCP dielectric material, in accordance with embodiments of the present invention. In FIG. 5, an autoclave 400 comprises a chamber 404 surrounded by an enclosure 402. The chamber 404 comprises a vacuum bag 419 enclosed by flexible membrane 418. A book 410 is placed within the vacuum bag 419. The vacuum bag 419 can have various configurations, but it must completely envelope the book 410, and provide some flexibility so that the vacuum bag 419 will conform to the book 410 upon evacuation (described infra). The vacuum bag 419 and the book 410 therewithin are placed in the chamber 404 which is then sealed. The vacuum bag 419 may also include a breather ply 409 for the purpose of facilitating complete evacuation of the vacuum bag 419. The vacuum bag 419 with the included book 410 is mechanically supported by a carrier tray 412. The flexible membrane 418 provides a pressure boundary that interfaces with a pressurized, heated gas 420 (e.g., nitrogen) within the portion of the chamber 404 that is exterior to the flexible membrane 418. The pressure differential between the space exterior to the flexible membrane 418 and the space within the vacuum bag 419 may be further controlled by evacuating the air from within the vacuum bag 419 by a vacuum pump 406 via a vacuum supply line 408. The pressurized, heated gas 420 is supplied to the chamber 404 by a source 414 through gas inlet tubing 416. Thus the gas 420 is a medium through which elevated temperature and pressure are applied to book 410 so as to laminate the pages contained within the book 410. The resulting laminations are similar to that achieved in a flat bed lamination press, in that compressive stresses normal to the book 410 are achieved. However, the pressure uniformity is generally improved by the use of the autoclave 400, since there is an absence of shear tractions on the outer surface of the book 410. Although FIG. 5 shows one vacuum bag 419, the scope of the present invention also includes a plurality of such vacuum bags within the chamber 404.

For both the flat bed lamination press and the autoclave lamination press, the temperatures, pressures, and dwell times are in accordance with the need to laminate one or more layers of LCP dielectric material to other layers of material, as discussed infra. Thus during the lamination process, the LCP dielectric material should be laminated at a temperature T wholly in the liquid crystal temperature range (i.e., $T<T_{NI}$) with no excursion into the isotropic temperature range, under sufficient pressurization and for a sufficient dwell time to cause the LCP dielectric material to be effectively laminated to the layer of material. For many applications, pressure in the range of 1000 to 3000 psi will effectuate good adhesion. The dwell time for maximum temperature and pressure should generally be at least 2 minutes, and applicable ranges of dwell times include, inter alia, 2 to 60 minutes and 15 to 30 minutes.

It is known in the art that for lamination of conventional thermoset dielectric layers (e.g. epoxy/glass pre-preg), comparable results (e.g., with respect to adhesion and flow) can be obtained at reduced pressure in an autoclave versus a flat bed press. This suggests that in the case of LCP lamination, reduced pressures (perhaps by as much as a factor of two) may be effective, and thus desirable for reducing costs associated with autoclave lamination.

In addition to use of the flat bed lamination press and the autoclave lamination press for laminating stacked LCP dielectric layers to other layers, other lamination press hardware known to one of ordinary skill in the art may be used for accomplishing such laminations in accordance with the aforementioned conditions on temperature, pressure, and dwell time.

The lamination process can be used to stack layers of LCP dielectric material with layers of dielectric material (i.e., either LCP dielectric or non-LCP dielectric) or metallic layers, (e.g., signal planes, power planes, ground planes, etc.). With such stacking, attention should be given to achieving correct layer to layer alignment. Each copper clad dielectric core can have reference (fiducial) holes that are used for mechanical pins to provide layer to layer alignment. Both the photolithography steps to form circuit features and the lamination process can utilize these reference holes. Special tooling that includes plates with corresponding holes that accommodate the pins are used. The reference holes in the dielectric cores can be formed prior to and used as a reference for the photolithography steps, or alternately, they can be formed after the photolithography steps and then drilled in reference to the circuit features. This technique allows for calculation of the optimal location for the pin holes, given that some distortion or size change of the core may have occurred during the photolithography (especially for thin layers). A further alternative is to use a means of optical alignment, where the circuit features on the cores are detected, and then the layers are positioned and held in place for the lamination process, without using any pins.

FIGS. 6–15 depict steps in the formation of a circuitized layer and FIGS. 16–19 depict formation of a multilayered stack with Z-axis interconnections, in accordance with embodiments of the present invention.

Figure 6:
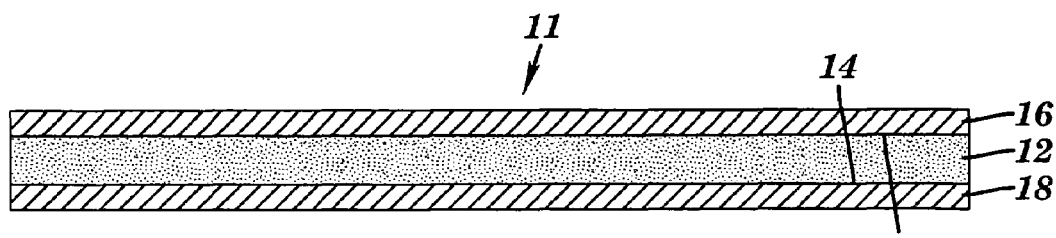
FIG. 6 depicts an electrical structure having a double-sided cladded laminate with first and second electrically conductive layers respectively positioned on opposite surfaces of a dielectric layer, in accordance with embodiments of the present invention.

FIG. 6 depicts an electrical structure 11 having a double-sided cladded laminate with continuous electrically conductive layers 16 and 18 respectively positioned on opposite surfaces 13 and 14 of a dielectric layer 12, in accordance with embodiments of the present invention. The dielectric layer 12 may comprise any type of dielectric material known to one of ordinary skill in the art (e.g., organic dielectric material; polyimide (e.g., KAPTON®, UPILEX®, etc.); ceramic dielectric material; woven or non-woven fiber (e.g., glass, aramid, etc.) reinforced resin sheet; particulate filled fluoro-polymer; LCP dielectric material; or any of the other dielectric materials currently used as clad laminate materials in the printed wiring board (PWB) industry or base material in the flex circuit industry. The dielectric layer 12 should have sufficient mechanical integrity to support the conductive circuit features after they have been patterned and not suffer detrimental effects at the required joining temperatures. The dielectric layer 12 may be optimized for other parameters such as electrical characteristics (e.g., dielectric constant and loss), mechanical properties, thermal properties, dimensional stability, etc.

The conductive layers 16 and 18 of FIG. 6 may each comprise any electrically conductive material that can be patterned, and is solderable or can have a solderable surface layer applied. Metals (e.g., copper) may be used in the conductive layers 16 and 18. Each of the conductive layers layers 16 and 18 can be applied to the dielectric layer 12 by laminating a foil, physical vapor deposition (i.e., vacuum evaporation or sputtering), electroplating or electroless plating, chemical vapor deposition (CVD), or other means known to one of ordinary skill in the art. Alternatively, the dielectric layer 12 could be applied to a metal foil by such methods as screening, slot coating, curtain coating, doctor blading, roll coating, rod coating, spraying, etc. Two particularly advantageous classes of starting materials for the electrical structure 11 are: 1) double sided, copper clad laminates, as commonly supplied to the PWB industry; and 2) copper clad films, as commonly supplied to the flex circuit industry and as described infra in conjunction with FIG. 9. A double sided, copper clad laminate has the advantage of having a rough, high area, surface, which will eventually need to bond with the infused liquid resin in the embodiment of FIG. 20, after etching the laminated foil. Depending on the materials of the dielectric layer 12 and conductive layers 16 and 18, it may be possible to purchase the electrical structure 11 of FIG. 6 (e.g., copper cladded LCP dielectric material). If the dielectric layer 12 comprises LCP dielectric material then one can laminate sheets of metal (e.g., copper) to the dielectric layer 12 by the methods disclosed supra in conjunction with FIGS. 1–5. Otherwise, the electrical structure 11 in FIG. 1 may be formed by any method known to one of ordinary skill in the art.

Figure 7:
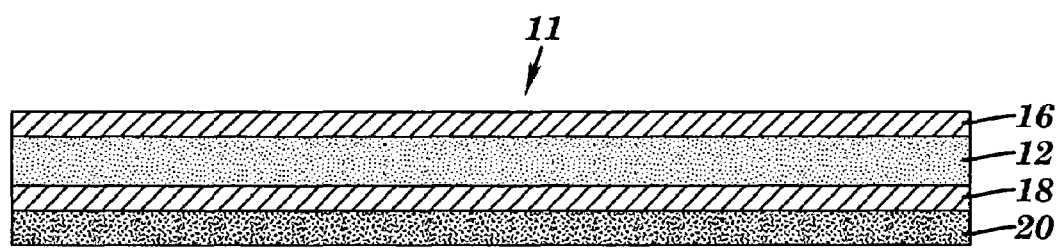
FIG. 7 depicts the electrical structure of FIG. 6 after a removable protective coating has been applied to the first electrically conductive layer, in accordance with embodiments of the present invention.

FIG. 7 depicts the electrical structure 11 of FIG. 6 after a removable protective coating 20 (e.g., resist) has been applied to the electrically conductive layer 18 where electrically conductive circuitry will be subsequently formed, in accordance with embodiments of the present invention. The protective coating 20 will allow etching the conductive layer 16 so as to protect the cladding of the conductive layer 18 from handling damage prior to circuit patterning, and act as a plating resist if dielectric via holes are to be filled with conductive material by a plating process. Use of the protective coating 20 is optional.

Figure 8:
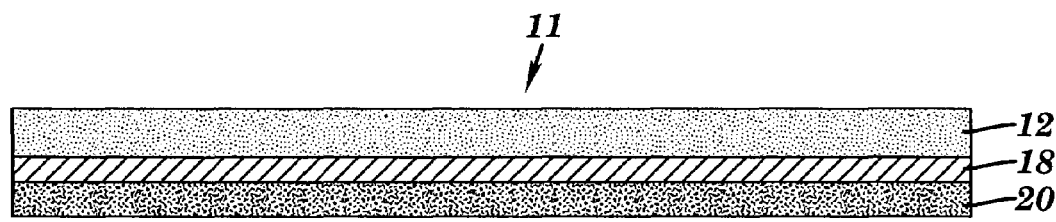
FIG. 8 depicts the electrical structure of FIG. 7 after removal of the second electrically conductive layer, in accordance with embodiments of the present invention.

FIG. 8 depicts the electrical structure 11 of FIG. 7 after optional removal of the electrically conductive layer 16 which is not intended to be subsequently circuitized, in accordance with embodiments of the present invention. The conductive layer 16 may be removed by any method known to a person of ordinary skill in the art such as by chemical etching.

Figure 9:
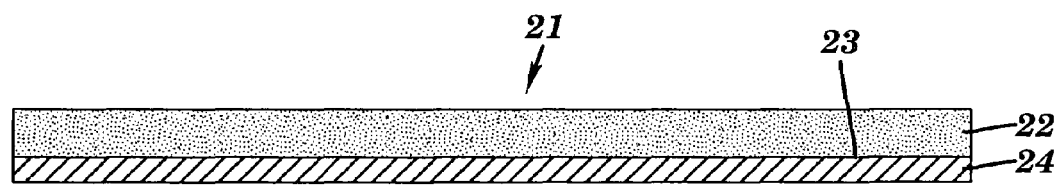
FIG. 9 depicts an electrical structure having a single-sided cladded laminate with an electrically conductive layer positioned on a surface of a dielectric layer, in accordance with embodiments of the present invention.

FIG. 9 depicts an electrical structure 21 having a single-sided cladded laminate with an electrically conductive layer 24 positioned on a surface 23 of a dielectric layer 22, in accordance with embodiments of the present invention. The dielectric layer 22 may include any of the dielectric materials that may be comprised by the dielectric layer 12 of FIG. 6, discussed supra. The electrically conductive layer 24 may include any of the electrically conductive materials that may be comprised by the conductive layer 16 or 18 of FIG. 6, discussed supra. The conductive layer 24 may be applied to the dielectric by layer 22 by any method described supra in conjunction with FIG. 6 for applying the conductive layer 16 or 18 to dielectric layer 12 of FIG. 6. Depending on the materials of the dielectric layer 22 and conductive layer 24 and 18, it may be possible to purchase the electrical structure 21 of FIG. 9 (e.g., copper cladded LCP dielectric material).

Figure 10:
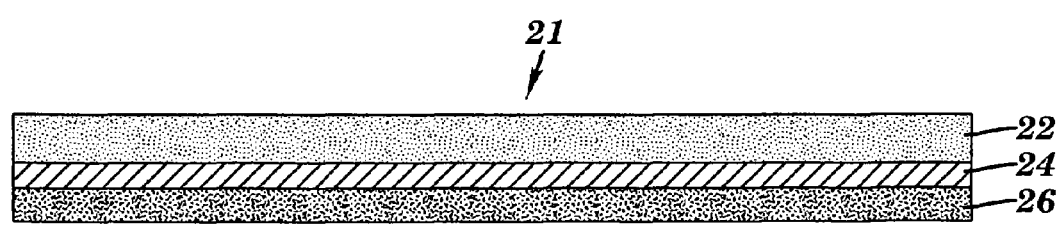
FIG. 10 depicts the electrical structure of FIG. 9 after a protective coating has been applied to the electrically conductive layer, in accordance with embodiments of the present invention.

FIG. 10 depicts the electrical structure 21 of FIG. 9 after a removable protective coating 26 (e.g., resist) has been applied to the electrically conductive layer 24 where electrically conductive circuitry will be subsequently formed, in accordance with embodiments of the present invention. The protective coating 26 will protect the conductive layer 24 from handling damage prior to circuit patterning, and act as a plating resist if dielectric via holes are to be filled with conductive material by a plating process. Use of the protective coating 26 is optional and is analogous to the protective coating 20 of FIGS. 7–8. Note that the electrical structures 11 and 21 of FIGS. 8 and 10, respectively, are essentially the same electrical structures.

Figure 11:
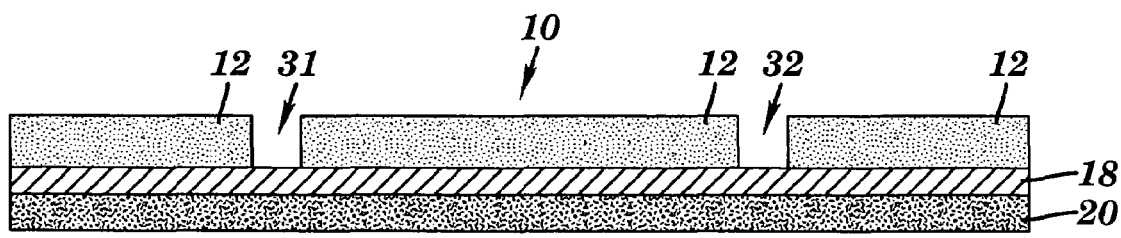
FIG. 11 depicts the electrical structure of FIG. 8 or FIG. 10 after formation of vias in the dielectric layer, in accordance with embodiments of the present invention.

FIG. 11 depicts an electrical structure 10 derived from the electrical structure 11 of FIG. 8 (or, equivalently, the electrical structure 21 of FIG. 10) after formation of vias 31 and 32 in the dielectric layer 12, in accordance with embodiments of the present invention. The vias 31 and 32 may be formed by any process known to one of ordinary skill in the art, such as laser drilling, plasma etching, etc.

Figure 12:
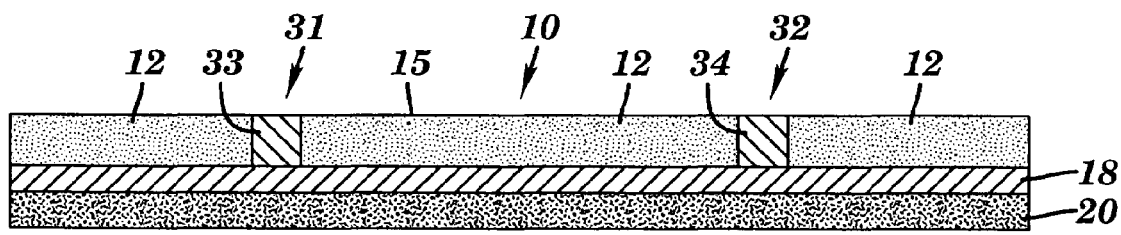
FIG. 12 depicts the electrical structure of FIG. 1 after the vias have been filled with an electrically conductive material to form electrically conductive plugs in the vias, in accordance with embodiments of the present invention.

FIG. 12 depicts the electrical structure 10 of FIG. 11 after the vias 31 and 32 have been filled with an electrically conductive filling material to form electrically conductive plugs 33 and 34, respectively, in the vias 31 and 32, in accordance with embodiments of the present invention. The exposed surface of the electrically conductive filling material should be even with, or slightly above the surface 15 of the dielectric layer 12 after filling the vias 31 and 32 to assure good electrically conductive contact during subsequent joining with an external electrically circuitized layer as described infra in conjunction with FIG. 19. In FIG. 12, filling the vias 31 and 32 to form the conductive plugs 33 and 34 can be accomplished by any process known to one of ordinary skill in the art such as, inter alia, by a plating of metal (e.g., electroplating or electroless plating), or by forcing (e.g. by squeegeeing) electrically conductive paste into the vias and subsequently curing the paste. Having a continuous conductive layer on the circuit side of the layer is particularly advantageous in the case of electroplating. In the case of conductive paste via fill, it may be desirable to modify the surface of the fill material to assure good solder bonding during the joining described infra in conjunction with FIG. 19. The conductive plugs 33 and 34 may each comprise any electrically conductive material that can be used to fill the vias 31 and 32, respectively.

Figure 13:
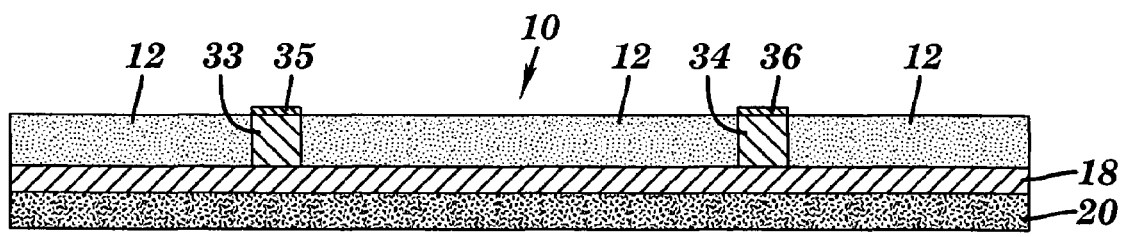
FIG. 13 depicts the electrical structure of FIG. 12 after an electrically conductive cap has been formed on the electrically conductive plugs, in accordance with embodiments of the present invention.

FIG. 13 depicts the electrical structure 10 of FIG. 12 after electrically conductive caps 35 and 36 have been formed on the electrically conductive plugs 33 and 34, respectively, in accordance with embodiments of the present invention. The conductive caps 35 and 36 may comprise a thin layer (e.g., 0.1 mils–0.4 mils thickness) of tin or tin containing solder alloy. The conductive caps 35 and 36 may be formed with electroplating or electroless plating, both of which are maskless and self aligning for this process. Other solder alloys which are found to be compatible with fluxless soldering would be suitable replacements for tin containing solder alloys in these processes and structures. The conductive caps 35 and 36 may include any electrically conductive material that melts, and functions as a solder during subsequent joining of the electrical structure 10 with an external electrically circuitized layer as described infra in conjunction with FIG. 19.

Figure 14:
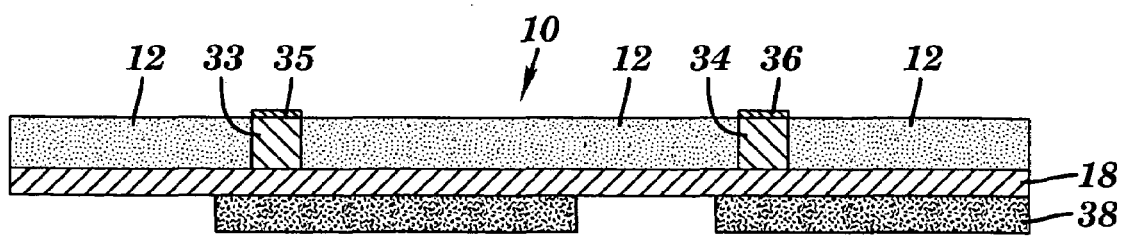
FIG. 14 depicts the electrical structure of FIG. 13 after removal of the protective layer, and after a photoresist has been patterned, exposed, and developed after being applied to the copper foil, in accordance with embodiments of the present invention.

FIG. 14 depicts the electrical structure 10 of FIG. 13 after removal of the protective layer 20, and after a photoresist 38 has been patterned, exposed, and developed after being applied to the conductive layer 18, in accordance with embodiments of the present invention. The patterning of the photoresist 38 is in accordance with the circuit pattern to be subsequently formed, as described infra in conjunction with FIG. 15.

Figure 15:
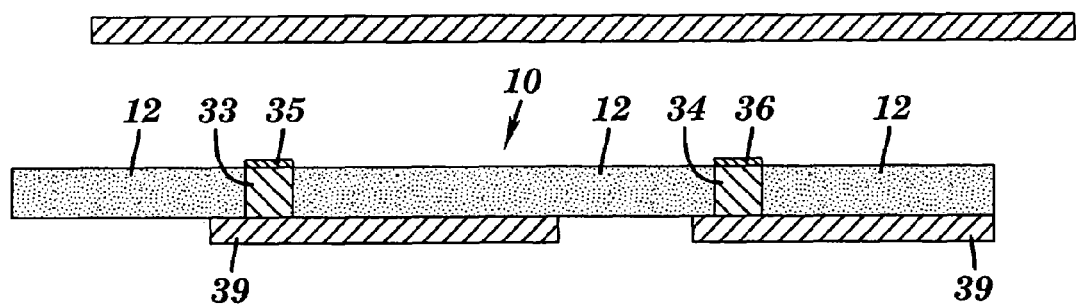
FIG. 15 depicts the electrical structure of FIG. 14 after the copper foil has been circuitized in accordance with the photoresist pattern, and after the photoresist has been removed to form a circuitized layer, in accordance with embodiments of the present invention.

FIG. 15 depicts the electrical structure 10 of FIG. 14 after the conductive layer 18 (e.g., copper foil) has been circuitized to form the circuitization 39 in accordance with the photoresist pattern of the photoresist 38 (see FIG. 14), and after the photoresist 38 has been removed such that the electrical structure 10 has become a circuitized layer, in accordance with embodiments of the present invention.

Figure 16:
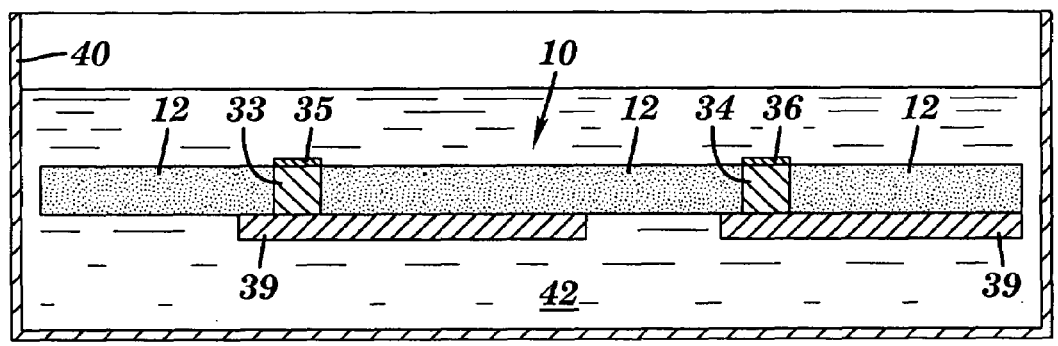
FIG. 16 depicts the electrical structure (i.e., circuitized layer) of FIG. 15 immersed in a plating solution, in accordance with embodiments of the present invention.

FIG. 16 depicts the electrical structure 10 (i.e., circuitized layer) of FIG. 15 immersed in a plating solution 42 (e.g., a tin plating solution) within a container 40, in accordance with embodiments of the present invention. Said immersion of the electrical structure 10 in the plating solution 42 is optional and may enhance wetting, and thus yields, at joining of the electrical structure 10 with an external electrically circuitized layer as described infra in conjunction with FIG. 19. With a tin plating solution, formation of a tin oxide on the surface of the circuitization 39 (e.g., copper circuitry) may provide better adhesion of the infused resin to the circuitry than the native copper oxide in the resin infusion embodiment discussed infra in conjunction with FIG. 20.

Figure 17:
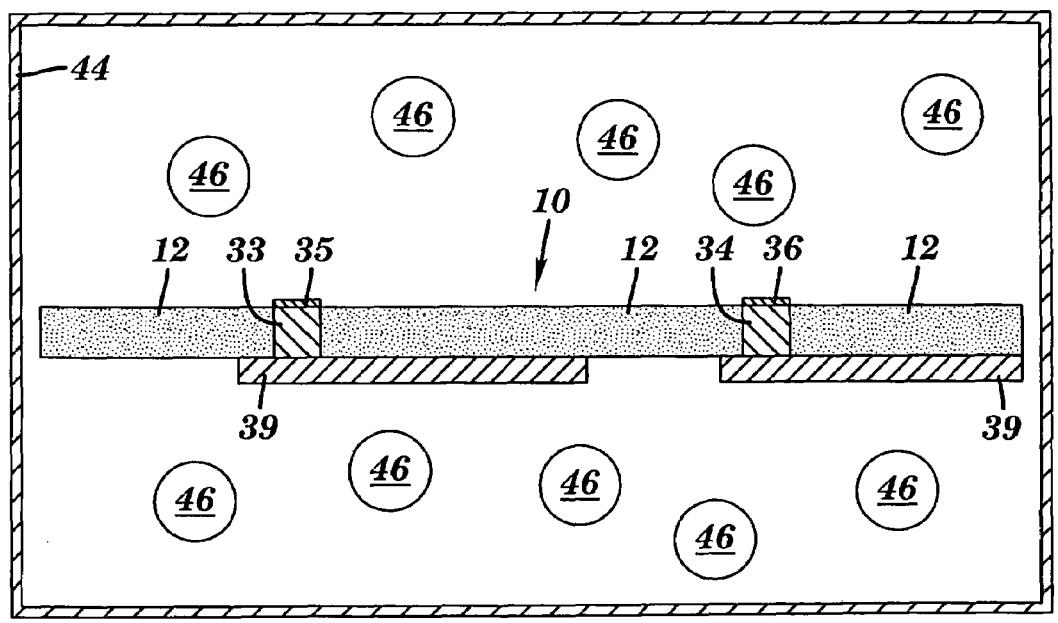
FIG. 17 depicts the electrical structure (i.e., circuitized layer) of FIG. 15 being treated with a plasma such as a fluorinated plasma gas, in accordance with embodiments of the present invention.

FIG. 17 depicts the electrical structure 10 (i.e., circuitized layer) of FIG. 15 being treated with a plasma (e.g., a fluorinated plasma gas) in a plasma reaction chamber 44, in accordance with embodiments of the present invention. In FIG. 17, the plasma reaction generates fluorine ions 46 which interact with metal surfaces (e.g., tin, copper, etc) of the conductive caps 35 and 36 and the circuitization 39 to form fluorides or oxifluorides (e.g., tin oxifluoride). This plasma treatment improves wetting of the metal surfaces so that subsequent soldering may be effectuated, as described infra in conjunction with FIG. 19, without the need for a fluxing agent during the solder reflow and joining step of FIG. 19. Such use of a fluorinated plasma gas is described in: U.S. Pat. No. 4,921,157 to Dishon et al. 1990 (incorporated herein by reference in its entirety); U.S. Pat. No. 5,407,121 to Koopman et al. 1995 (incorporated herein by reference in its entirety); and U.S. Pat. No. 5,776,551 to Pasch 1998 (incorporated herein by reference in its entirety).

Figure 18:
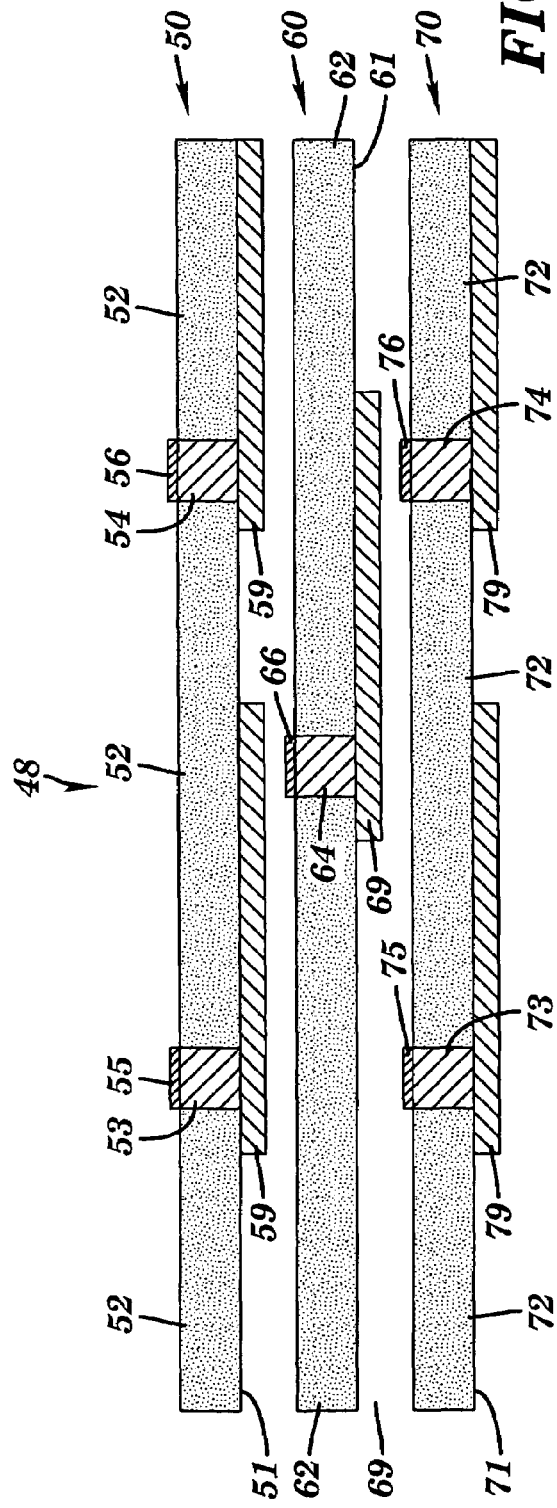
FIG. 18 depicts multiple circuitized layers stacked and aligned to form a multilayered stack with Z-axis interconnections, in accordance with embodiments of the present invention.

FIG. 18 depicts circuitized layers 50, 60, and 70 stacked and aligned to form a multilayered stack 48 with Z-axis interconnections (which will be defined infra in conjunction with FIG. 19), in accordance with embodiments of the present invention. The circuitized layer 50 comprises an electrical circuitization 59 on a surface 51 of dielectric layer 52. Electrically conductive plugs 53 and 54 are electrically and mechanically connected to the electrical circuitization 59 and are respectively capped with electrically conductive caps 55 and 56. The circuitized layer 60 comprises an electrical circuitization 69 on a surface 61 of dielectric layer 62. Electrically conductive plug 64 is electrically and mechanically connected to the electrical circuitization 69 and is capped with electrically conductive cap 66. The circuitized layer 70 comprises an electrical circuitization 79 on a surface 71 of dielectric layer 72. Electrically conductive plugs 73 and 74 are electrically and mechanically connected to the electrical circuitization 79 and are respectively capped with electrically conductive caps 75 and 76. For many applications, standard alignment methods, such as slots over pins, will provide adequate registration of the circuitized layers 50, 60, and 70. For very dense structures with critical registration tolerances, optical alignment of adjacent layers may be required. In either case, it is possible to reduce alignment shifts during mass joining by tack soldering a few joints per square inch as each new circuitized layer is added to the multilayered stack 48. Tack soldering can be accomplished by pressing over the joint location with a hot probe (e.g., a fine tipped soldering iron) from the circuit side of the circuitized layer (for better heat transfer).

Figure 19:
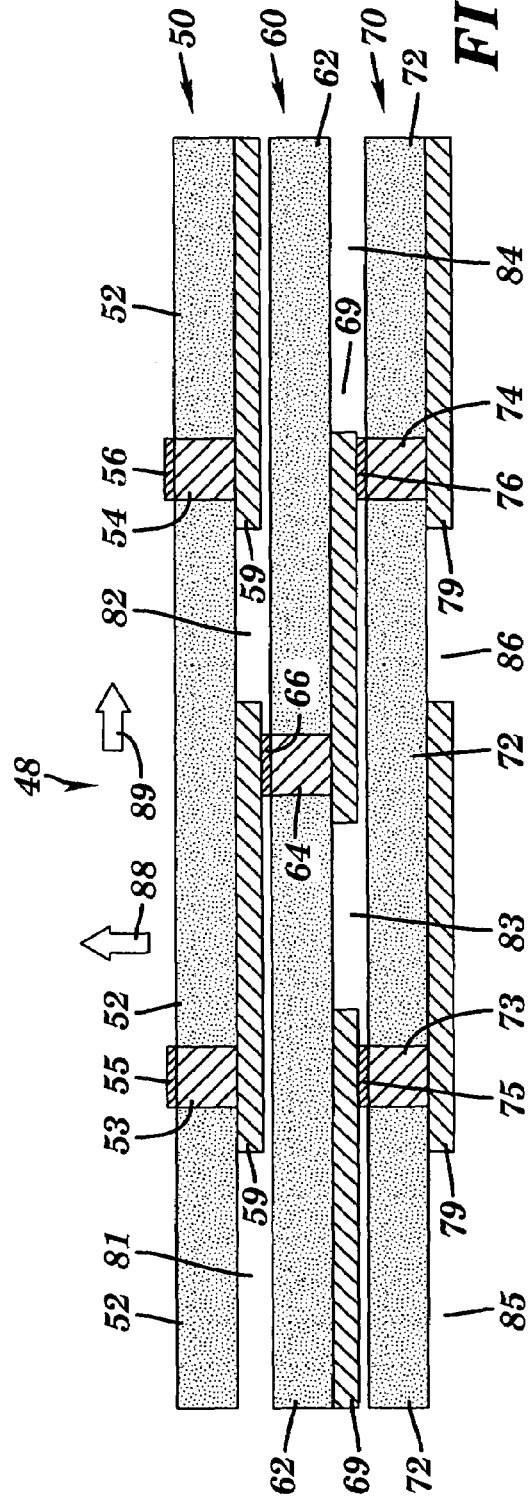
FIG. 19 depicts the multilayered stack of FIG. 18 after the circuits on adjacent layers have been electrically joined by soldering leaving void volumes in the multilayered stack, in accordance with embodiments of the present invention.

FIG. 19 depicts the multilayered stack 48 of FIG. 18 after the circuitizations on adjacent circuitized layers have been electrically joined through conductive plugs by soldering ("solder joining") using the relevant interfacing conductive caps as solder, which forms the void volumes 81–86 in the multilayered stack 48, in accordance with embodiments of the present invention. For example, the circuitization 59 of circuitized layer 50 is electrically joined to the circuitization 69 of circuitized layer 60 by the conductive plug 64 of the circuitized layer 60 using the conductive cap 66 as solder. As another example, the circuitization 69 of circuitized layer 60 is electrically joined to the circuitization 79 of circuitized layer 70 by the conductive plug 74 of the circuitized layer 70 using the conductive cap 76 as solder. Note that the conductive plugs 64 and 74 of adjacent circuitized layers 60 and 70 are both oriented in the layer thickness direction 88, and are offset with respect to each other in the direction 89 that is perpendicular or about perpendicular to the layer thickness direction 88. Alternatively, the conductive plugs 64 and 74 may be positioned so as not to be offset with respect to each other in the direction 89. In the preceding examples, the conductive plug 64 forms a "Z-axis" interconnection between the circuitized layers 50 and 60, wherein the conductive plug 64 mechanically and electrically connects the circuitizations 59 and 69 with each other. The "Z-axis" is an axis in the direction 88. Similarly, the conductive plug 74 forms a "Z-axis" interconnection between the circuitized layers 60 and 70, wherein the conductive plug 74 mechanically and electrically connects the circuitizations 69 and 79 with each other.

Use of the Z-axis interconnections eliminates the need for plated through holes to make layer to layer electrical connections. Instead, electrical connections are made from one layer to another by forming chains or stacks of solder connections between pads. This is more compact and space efficient than plated through holes. With the present invention, individual layers are formed in parallel and then aligned and joined which results in a substantial reduction in fabrication time as compared with the conventional sequential build-up micro-via technologies.

In FIG. 19, joining of the circuitized layers 50, 60, and 70 (i.e., "mass joining") is accomplished by heating the circuitized layers 50, 60, and 70 to a temperature that exceeds the melting point of the solder which caps the filled vias (i.e., the melting temperature of the electrically conductive caps 55, 56, 66, 75, and 76). Heating can be performed in a batch or conveyorized oven, or between heated platens. Light pressure, applied by parallel plates above and below the multilayered stack 48, is all that is needed to provide joint contact for joining. Pressure beyond that required to insure contact of surfaces to be joined is not needed or desirable. A traditional laminating press is not required. The joining atmosphere can be ambient, inert (e.g. nitrogen), or vacuum. Application of a vacuum at some point while at joining temperatures may improve the escape of any materials volatilized during the joining process. As stated supra, the joining process is performed fluxlessly; i.e., without the need for a fluxing agent during the solder reflow and joining step.

Figure 20:
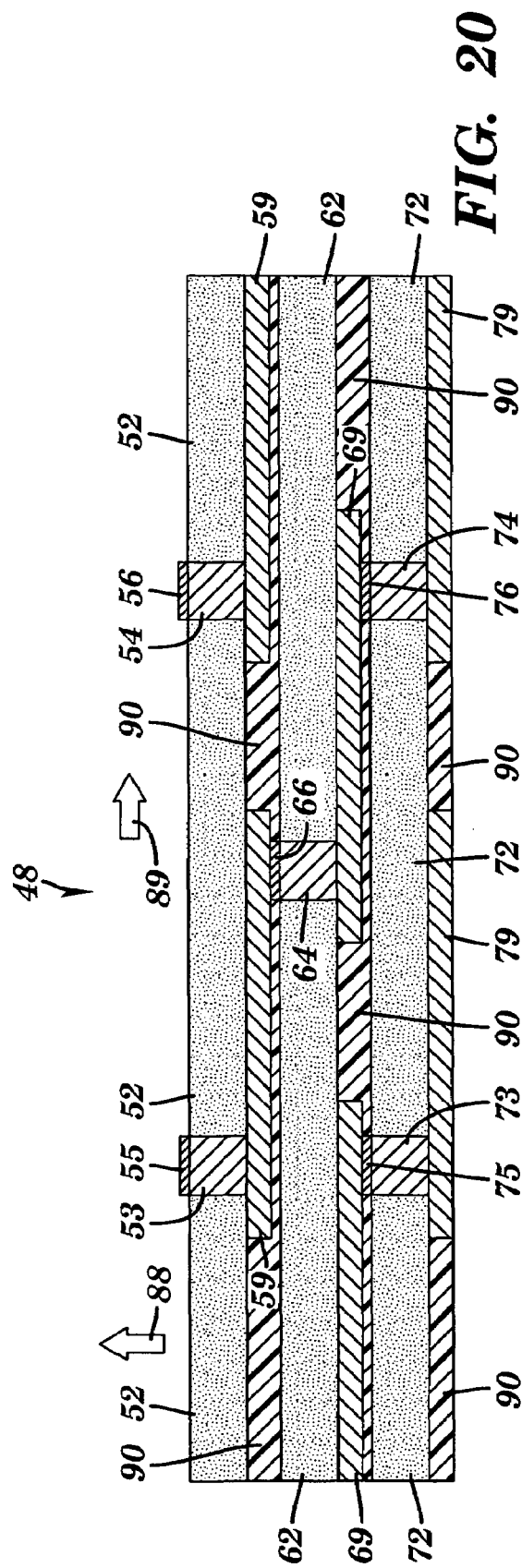
FIG. 20 depicts the multilayered stack of FIG. 19 after resin has been infused into the void volumes and subsequently cured.

FIG. 20 depicts the multilayered stack 48 of FIG. 19 after a resin 90 (e.g., a low viscosity, thermosetting resin) has been infused into the void volumes 81–86 and subsequently cured. Said infusion of resin 90 may be achieved by a process known as vacuum bagging. A gas impermeable, flexible covering is placed around the multilayered stack 48, and sealed around the top and bottom periphery of the multilayered stack 48. A series of (generally opposed) vacuum and resin supply ports are placed around the edges of the joined structure. The atmosphere within the flexible covering is evacuated, through the vacuum port(s), by means of a vacuum pump, and the resin is allowed to flow into the area within the flexible covering through the resin port(s). Surface tension and atmospheric pressure pushing on the resin supply cause the resin to flow into all of the void volumes 81–86. The resin is then thermally cured, resulting in a monolithic structure.

In FIG. 20, some or all of the electrically conductive plugs 53, 54, 64, 73, and 74 may be parallel or about parallel to each other, and oriented in the direction 88 or approximately in the direction 88. Some or all of the electrically conductive plugs 53, 54, 64, 73, and 74 may be offset from each other in the direction 89 that is perpendicular or about perpendicular to the direction 88.

After infusion of resin 90, it may not be necessary to form a through hole through the multilayered stack 48; however, the present invention permits forming a through hole through the multilayered stack 48 after infusion of resin 90.

Figure 21:
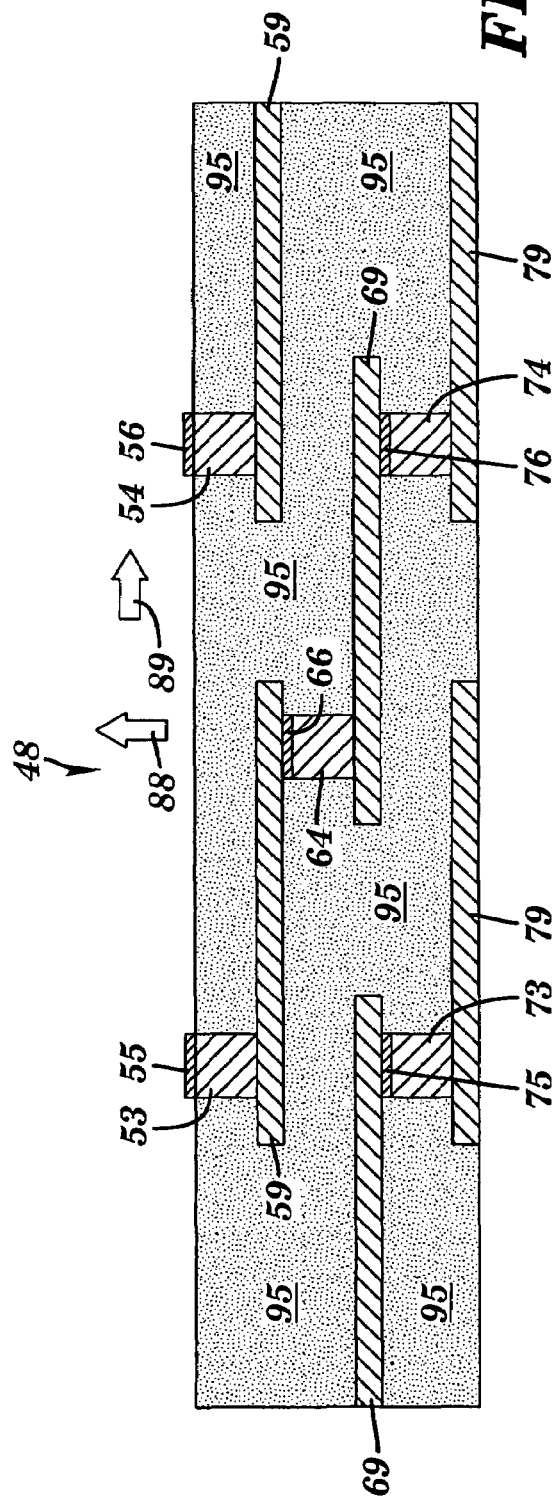
FIG. 21 depicts the multilayered stack of FIG. 19 with the dielectric layers comprising a liquid crystal polymer (LCP) material and after high pressure has been applied to the multilayered stack to fill the void volumes with the LCP material and bond dielectric layers of adjacent circuitized layers with each other, in accordance with embodiments of the present invention.

FIG. 21 depicts the multilayered stack 48 of FIG. 19 with the dielectric layers 52, 62, and 72 each comprising a liquid crystal polymer (LCP) material and after high pressure has been applied to the multilayered stack 48 to fill the void volumes 81–86 with the LCP material and bond dielectric layers of adjacent circuitized layers with each other (i.e., dielectric layers 52 with dielectric layer 62; and dielectric layer 62 with dielectric layer 72), in accordance with embodiments of the present invention. Referring to FIG. 19, the void volumes 81 and 82 are respectively filled with LCP material from at least one of the LCP dielectric layers 52 and 62. The void volumes 83 and 84 are respectively filled with LCP material from at least one of the LCP dielectric layers 62 and 72. The void volumes 85 and 86 are filled with LCP material from LCP dielectric layer 72 and from any other LCP dielectric layer that is adjacent to void volumes 85 and 86. In FIG. 21, the dielectric layers 52, 62, and 72 of FIG. 19 each comprise the same LCP material 95. Generally, the dielectric layers 52, 62, and 72 may each comprise a same dielectric LCP material or different LCP dielectric materials In FIG. 21, some or all of the electrically conductive plugs 53, 54, 64, 73, and 74 may be parallel or about parallel to each other, and oriented in the direction 88 or approximately in the direction 88. Some or all of the electrically conductive plugs 53, 54, 64, 73, and 74 may be offset from each other in the direction 89 that is perpendicular or about perpendicular to the direction 88.

The multilayered stack 48 in FIG. 21 has been laminated together by any of the methods discussed supra in conjunction with FIGS. 1–5 for bonding LCP material to adjacent layers. In particular, the lamination temperature T is to be wholly in the liquid crystal temperature range (i.e., $T<T_{NI}$) of the LCP dielectric material of dielectric layers 52, 62, and 72 with no excursion into the isotropic temperature range, under sufficient pressurization (e.g., 1000 to 3000 psi) and for a sufficient dwell time to cause the LCP dielectric material of dielectric layers 52, 62, and 72 to plastically deform such that: 1) the dielectric layer 62 is directly bonded to the dielectric layer 52 with no extrinsic adhesive material disposed between the dielectric layer 62 and the dielectric layer 52; 2) the dielectric layer 62 is directly bonded to the circuitization 59 with no extrinsic adhesive material disposed between the dielectric layer 62 and the circuitization 59; 3) the dielectric layer 72 is directly bonded to the dielectric layer 62 with no extrinsic adhesive material disposed between the dielectric layer 72 and the dielectric layer 62; and 4) the dielectric layer 72 is directly bonded to the circuitization 69 with no extrinsic adhesive material disposed between the dielectric layer 72 and the circuitization 69. The dwell time for maximum temperature and pressure should generally be at least 2 minutes, and applicable ranges of dwell times include, inter alia, 2 to 60 minutes and 15 to 30 minutes. FIG. 22 shows that said lamination process caused the void volumes 81–86 to be filled with the LCP dielectric material of dielectric layers 52, 62, and 72. If multiple LCP dielectric materials are used in the dielectric layers 52, 62, and 72, then the value of $T_{NI}$ to be employed for satisfying $T<T_{NI}$ is the lowest value of $T_{NI}$ of all such LCP dielectric materials included within the dielectric layers 52, 62, and 72. The polymer chain structure and associated directional orientation of the LCP dielectric material of dielectric layers 52, 62, and 72 remains essentially unchanged throughout the dwell time. Similarly, the coefficient of thermal expansion (CTE) of the LCP dielectric material of dielectric layers 52, 62, and 72 remains essentially unchanged throughout the dwell time. The use of the LCP material in the dielectric layers 52, 62, and 72 avoids the resin infusion step described supra in conjunction with FIG. 20.

Formation of the multilayered stack 48 of FIG. 21, with dielectric layers 52, 62, and 72 each comprising a LCP material, has been described supra as comprising solder joining step (shown in FIG. 19) and a dielectric lamination step (shown in FIG. 21). In an alternative embodiment, the solder joining of FIG. 19 and the dielectric lamination of FIG. 21 can be performed simultaneously in a single step. In the alternative embodiment, the multilayered stack 48 of FIG. 18 is laminated together as described supra in conjunction with FIG. 21, subject to an additional constraint. The additional constraint is that the lamination temperature used for the dielectric lamination exceeds the melting point of the solder which caps the filled vias (i.e., the melting temperature of the electrically conductive caps 55, 56, 66, 75, and 76), so as to effectuate the same solder joining that is shown in FIG. 19.

The interconnect structure of the multilayered stack 48 may be complete at this time, or optionally, the interconnect structure may be drilled, plated and circuitized (using standard printed wiring board (PWB) processes) to allow mounting of pin-in-hole components. Mounting holes may be drilled and the interconnect structure may be used as a core/subcomposite in a higher level laminated interconnect structure, etc. After laminating together the multilayered stack 48 of FIG. 21, it may not be necessary to form a through hole through the multilayered stack 48; however, the present invention permits forming a through hole through the multilayered stack 48 after laminating together the multilayered stack 48 of FIG. 21.

The finishing operations are similar to those for traditional PWB's: application of a solder mask, modifying the surface finish (organic solder preservative, Ni/Au plating, solder coating, etc.), testing, machining to final outline, etc. Any of these finishing operations can be applied as needed, with the same wide variety of sequences as applicable to ordinary PWB's.

The multilayered stack 48 of the present invention can be used for, inter alia, the following types of applications: integrated circuit package substrates (e.g., chip carriers); PWB's for mounting and interconnecting a wide array of components that make up electronic products; and high density interconnect "patches" or appliques, which can be joined to lower density interconnect structures (e.g. traditional PWB's) using the same joining methods employed in fabricating the multi-layer patch, which provides for a localized area of high density interconnect where needed, without forcing the entire structure to be built at the premium costs required for the high density area.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming a multilayered stack, comprising the steps of:

forming a first dielectric layer that includes a first liquid crystal polymer (LCP) dielectric material, wherein a first electrical circuitization is on and in direct mechanical contact with a surface of the first dielectric layer;

forming a second dielectric layer that includes a second LCP dielectric material, wherein a first electrically conductive plug includes a first electrically conductive material and extends through a thickness of the second dielectric layer, wherein a second electrical circuitization is on and in direct mechanical contact with a surface of the second dielectric layer, wherein the second electrical circuitization is in direct mechanical and electrical contact with a first end of the first electrically conductive plug;

fluxlessly soldering the first electrically conductive plug to the first electrical circuitization; and subjecting the first dielectric layer, the second dielectric layer, and the first electrical circuitization to a temperature less than the lowest nematic-to-isotropic transition temperature of the first and second LCP dielectric materials, for a dwell time and at an elevated pressure that is sufficient to cause the first and second LCP dielectric materials to plastically deform and directly bond the second dielectric layer to the first dielectric layer and directly bond the second dielectric layer to the first electrical circuitization with no extrinsic adhesive material disposed between the second dielectric layer and the first dielectric layer and with no extrinsic adhesive material disposed between the second dielectric layer and the first electrical circuitization.

2. The method of claim 1, wherein the step of subjecting the first dielectric layer is performed after the fluxlessly soldering step.

3. The method of claim 1, wherein the step of subjecting the first dielectric layer is performed simultaneous with the fluxlessly soldering step.

4. The method of claim 1, wherein the polymer chain structure and associated directional orientation of the first and second LCP dielectric materials remains essentially unchanged throughout the dwell time.

5. The method of claim 1, wherein the coefficient of thermal expansion (CTE) of the first and second LCP dielectric materials remains essentially unchanged throughout the dwell time.

6. The method of claim 1, wherein the elevated pressure is in a range of about 1000 psi to about 3000 psi.

7. The method of claim 1, wherein the dwell time is at least about 2 minutes.

8. The method of claim 1, wherein the first LCP dielectric material and the second LCP dielectric material are a same LCP dielectric material.

9. The method of claim 1, wherein the first LCP dielectric material and the second LCP dielectric material are different LCP dielectric materials.

10. The method of claim 1, wherein the fluxlessly soldering step leaves a void volume between the first and second LCP dielectric layers and wherein the subjecting step causes the void volume to be filled by at least one of the first and second LCP dielectric materials.

* * * * *